United States Patent
Gochberg et al.

(10) Patent No.: US 6,602,346 B1
(45) Date of Patent: Aug. 5, 2003

(54) GAS-PURGED VACUUM VALVE

(75) Inventors: Lawrence A. Gochberg, Menlo Park, CA (US); Christopher W. Burkhart, Los Gatos, CA (US)

(73) Assignee: Novellus Systems, Inc., San Jose, CA (US)

( * ) Notice: Subject to any disclaimer, the term of this patent is extended or adjusted under 35 U.S.C. 154(b) by 148 days.

(21) Appl. No.: 09/643,523

(22) Filed: Aug. 22, 2000

(51) Int. Cl.$^7$ .................. H01L 21/306; C23C 16/00
(52) U.S. Cl. .................. 118/715; 118/733; 156/345.32
(58) Field of Search .................. 118/715–732, 733; 156/345.32

(56) References Cited

U.S. PATENT DOCUMENTS 5,997,588 A * 12/1999 Goodwin et al. .......... 29/25.01

FOREIGN PATENT DOCUMENTS

| JP | 6-185672 | * | 7/1994 | ............ F16K/51/02 |
| JP | HEI 6-185672 | | 7/1994 | ............ F16K/51/02 |
| JP | 11195649 A | * | 7/1999 | ............ H01L/21/31 |
| JP | 2000357678 | * | 12/2000 | ....... H01L/21/3065 |

* cited by examiner

Primary Examiner—Benjamin L. Utech
Assistant Examiner—Ram N Kackar
(74) Attorney, Agent, or Firm—DeLio & Peterson, LLC; Peter W. Peterson

(57) ABSTRACT

A vacuum valve assembly for use in a vacuum processing chamber includes a seat defining an opening in the vacuum valve, with the seat having a sealing face adjacent the opening and normal to the direction of the opening; and a gate having a sealing face adapted to mate with the seat sealing face, the gate being movable toward and away from the seat sealing face to seal and open the vacuum valve opening. A continuous elastomeric seal extends around the vacuum valve opening between the gate sealing face and the seat sealing face of sufficient size such that when the gate is positioned to seal the vacuum valve opening, there exists a gap between the gate sealing face and the seat sealing face. A purge gas port system, disposed in the seat or in the gate, has an inlet for a purge gas, an essentially continuous outlet extending around the vacuum valve opening and adjacent the elastomeric seal and gap, and a manifold system connecting the inlet and the outlet. When a purge gas is introduced through the inlet, the manifold distributes the gas to the outlet which evenly distributes the gas to the vicinity of the continuous elastomeric seal around the vacuum valve opening in the gap between the gate sealing face and the seat sealing face.

8 Claims, 7 Drawing Sheets

GAS-PURGED VACUUM VALVE

BACKGROUND OF THE INVENTION

1. Field of the Invention

This invention relates to processing of semiconductors used to make microelectronic devices and in particular to vacuum valves used in devices for processing such semiconductors.

2. Description of Related Art

Processing chambers are utilized for a variety of processes performed on microelectronic devices such as microelectronic circuits formed on silicon semiconductor substrates. Since these processes may be operated and performed under vacuum, vacuum gate valves are typically employed. Such vacuum gate valves, when used as wafer pass-throughs between vacuum chambers, are often referred to as slit valves. When the slit valve gate is open, semiconductor wafers may be moved from a transfer chamber to a load lock or process chamber or vice-versa. When closed, these valves prevent gas leakage between the transfer chamber and the process chamber. While such slit valves provide generally reliable seals for most processes, certain new deposition and clean processes have been found to rapidly attack elastomeric seal materials utilized in the slit valves. The attack on such elastomeric seal materials typically causes particle contamination or "adders" on wafers and also may cause vacuum leakage across the valve itself. Although a wide variety of elastomers are available, none thus far tested have shown a significant improvement in life over the normally employed fluoroelastomers.

The concept of purging the general area with an inert gas has been discussed in Japanese Patent Publication No. 6-185672. In this publication entitled Gate Valve Device For Use With A Vacuum, a guillotine type valve assembly employs gas ducts either in the valve seat or in the valve plate. These gas ducts are used to carry a non-active gas into the gap area between the valve plate and the valve seat. While such an approach has its advantages for shielding the O-rings used in the assembly with an inert gas during processing, the disclosed structure does not provide particularly effective control over the inert gas flow rate or distribution, and an overflow of such inert gas may interfere with the processing of the microelectronic device itself in the chamber.

Accordingly, there is a need for a valve system which may utilize a purge gas more efficiently and in a manner which would not tend to interfere with the processing of the microelectronic device.

Bearing in mind the problems and deficiencies of the prior art, it is therefore an object of the present invention to provide an efficient purge gas system for elastomeric seals in gate or slit valve assemblies used in microelectronic device processing.

It is another object of the present invention to provide a method and system whereby the purge gas is employed more efficiently.

It is a further object of the present invention to provide a method and system in which the purge gas is less likely to interfere with the processing of the microelectronic device in the processing chamber.

SUMMARY OF THE INVENTION

The above and other objects, which will be apparent to those skilled in the art, are achieved by the present invention which comprises, in a first aspect, a vacuum valve assembly for use in a vacuum processing chamber comprising: a vacuum processing chamber vacuum valve; a seat defining an opening in the vacuum valve, the seat having a sealing face adjacent to the opening and normal to the direction of the opening; and a gate having a sealing face adapted to mate with the seat sealing face, the gate being movable toward and away from the seat sealing face to seal and open the vacuum valve opening. A continuous elastomeric seal extends around the vacuum valve opening between the gate sealing face and the seat sealing face of sufficient size such that when the gate is positioned to seal the vacuum valve opening, there exists a gap between the gate sealing face and the seat sealing face. A purge gas port system has an inlet for a purge gas, an essentially continuous outlet extending around the vacuum valve opening and adjacent the elastomeric seal and gap, and a manifold system connecting the inlet and the outlet. When a purge gas is introduced through the inlet, the manifold distributes the gas to the outlet which evenly distributes the gas to the vicinity of the continuous elastomeric seal around the vacuum valve opening in the gap between the gate sealing face and the seat sealing face.

The purge gas port system may be disposed in the seat or in the gate. When in the latter, the purge gas port system outlet is preferably defined by a first gate portion having the continuous elastomeric seal secured on the gate sealing face and a second gate portion secured within the first gate portion and facing the vacuum valve opening, so that the purge gas outlet is formed by a gap between the first and second gate portions extending essentially continuously around the first gate portion adjacent the elastomeric seal. The gap between the first and second gate portions forming the purge gas outlet may be smaller than the gap between the gate sealing face and the seat sealing face.

In the vacuum valve assembly, the purge gas outlet may be formed by an opening narrower than the gap between the gate sealing face and the seat sealing face. The purge gas port system outlet itself may be a slit, a series of holes or slots, a porous media adjacent the elastomeric seal, or a porous portion of the elastomeric seal.

In another aspect, the present invention comprises a vacuum processing chamber comprising a vacuum processing chamber having a vacuum valve; a seat defining an opening in the vacuum valve, the seat having a sealing face adjacent the opening and normal to the direction of the opening; and a gate having a sealing face adapted to mate with the seat sealing face. The gate is movable toward and away from the seat sealing face to seal and open the vacuum valve opening, and includes a continuous elastomeric seal on the gate sealing face around the vacuum valve opening of sufficient size such that when the gate is positioned to seal the vacuum valve opening, there exists a gap between the gate sealing face and the seat sealing face. There is also provided a purge gas port system in the gate having an inlet for a purge gas, an essentially continuous outlet in the gate sealing face extending around the vacuum valve opening and within and adjacent the elastomeric seal, and a manifold system connecting the inlet and the outlet. When a purge gas is introduced through the inlet, the manifold distributes the gas to the outlet which evenly distributes the gas to the vicinity of the continuous elastomeric seal around the vacuum valve opening in the gap between the gate sealing face and the seat sealing face.

The purge gas port system outlet may be defined by a first gate portion having the continuous elastomeric seal secured on the gate sealing face and a second gate portion secured within the first gate portion and facing the vacuum valve opening. The purge gas outlet is formed by a gap between the first and second gate portions extending essentially continuously around the first gate portion adjacent the elastomeric seal. The gap between the first and second gate portions forming the purge gas outlet is smaller than the gap between the gate sealing face and the seat sealing face.

In another aspect, the present invention provides a vacuum processing chamber having a vacuum valve; a seat defining an opening in the vacuum valve, the seat having a sealing face adjacent the opening and normal to the direction of the opening; and a gate having a sealing face adapted to mate with the seat sealing face. The gate is movable toward and away from the seat sealing face to seal and open the vacuum valve opening, and includes a continuous elastomeric seal on the gate sealing face around the vacuum valve opening of sufficient size such that when the gate is positioned to seal the vacuum valve opening, there exists a gap between the gate sealing face and the seat sealing face. There is also provided a purge gas port system in the seat having an inlet for a purge gas, an essentially continuous outlet in the seat sealing face extending around the vacuum valve opening and within and adjacent the elastomeric seal, and a manifold system connecting the inlet and the outlet. When a purge gas is introduced through the inlet, the manifold distributes the gas to the outlet which evenly distributes the gas to the vicinity of the continuous elastomeric seal around the vacuum valve opening in the gap between the gate sealing face and the seat sealing face. The gap between the first and second gate portions forming the purge gas outlet may be smaller than the gap between the gate sealing face and the seat sealing face.

A further aspect of the present invention provides a method of extending life to a seal in a vacuum valve used in a vacuum processing chamber. The method comprises providing a semiconductor wafer processing chamber having a vacuum valve seat, a gate closing the vacuum valve seat, and a seal between the gate and the vacuum valve seat, the seal being exposed to the chamber. The method then includes introducing a reactive gas mixture to the chamber to process a semiconductor wafer therein, the reactive gas mixture comprising a reactive gas, adapted to react with a portion of the semiconductor wafer, diluted by a carrier gas, the reactive gas also being reactive with the seal. Thereafter, the method also includes introducing the carrier gas through an essentially continuous opening into the vicinity of the seal between the gate and the vacuum valve seat, with the carrier gas continuously flowing so as to initially shield the seal from the reactive gas and then subsequently pass into the chamber and mix with the reactive gas. The seal may form a gap between opposing sealing faces of the gate and seat, and the carrier gas may be introduced through an essentially continuous opening adjacent to narrower than the gap between the gate and seat sealing faces.

In yet another aspect, the present invention provides a method of extending life to a seal in a vacuum valve used in a vacuum processing chamber comprising providing a microelectronic circuit processing chamber having a vacuum valve seat, a gate closing the vacuum valve seat, and a seal between the gate and the vacuum valve seat, the seal being exposed to the chamber. The method then includes introducing a reactive gas mixture to the chamber to process a microelectronic device therein, the reactive gas mixture comprising a reactive gas adapted to react with a portion of the microelectronic device, diluted by a carrier gas, wherein said reactive gas is also reactive with said seal. The method then includes introducing a portion of the reactive gas, such as oxygen into the vicinity of the seal between the gate and the vacuum valve seat, the reactive gas portion flowing so as to initially shield the seal and then subsequently pass into the chamber and mix with the remaining reactive gas. The carrier gas may also comprise oxygen. The reactive gas portion is preferably introduced through an essentially continuous opening into the vicinity of the seal between the gate and the vacuum valve seat. The seal may form a gap between opposing sealing faces of the gate and seat, so that the reactive gas portion is introduced through an essentially continuous opening in the gate or seat. The reactive gas may include $NF_3$.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS(s)

Figure 1:
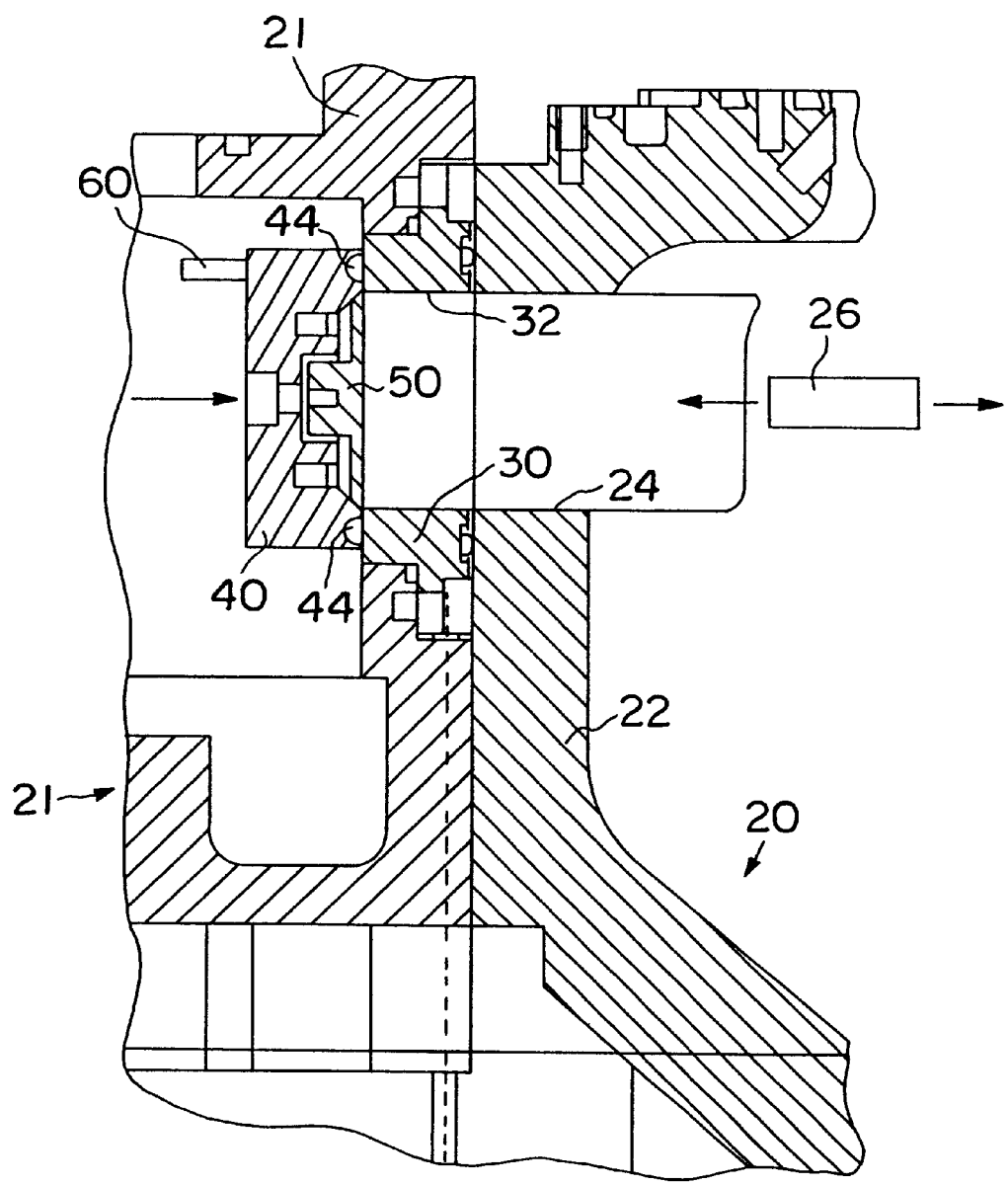
FIG. 1 is a cross-sectional elevational view of a first embodiment of the vacuum valve of the present invention.
Figure 2:
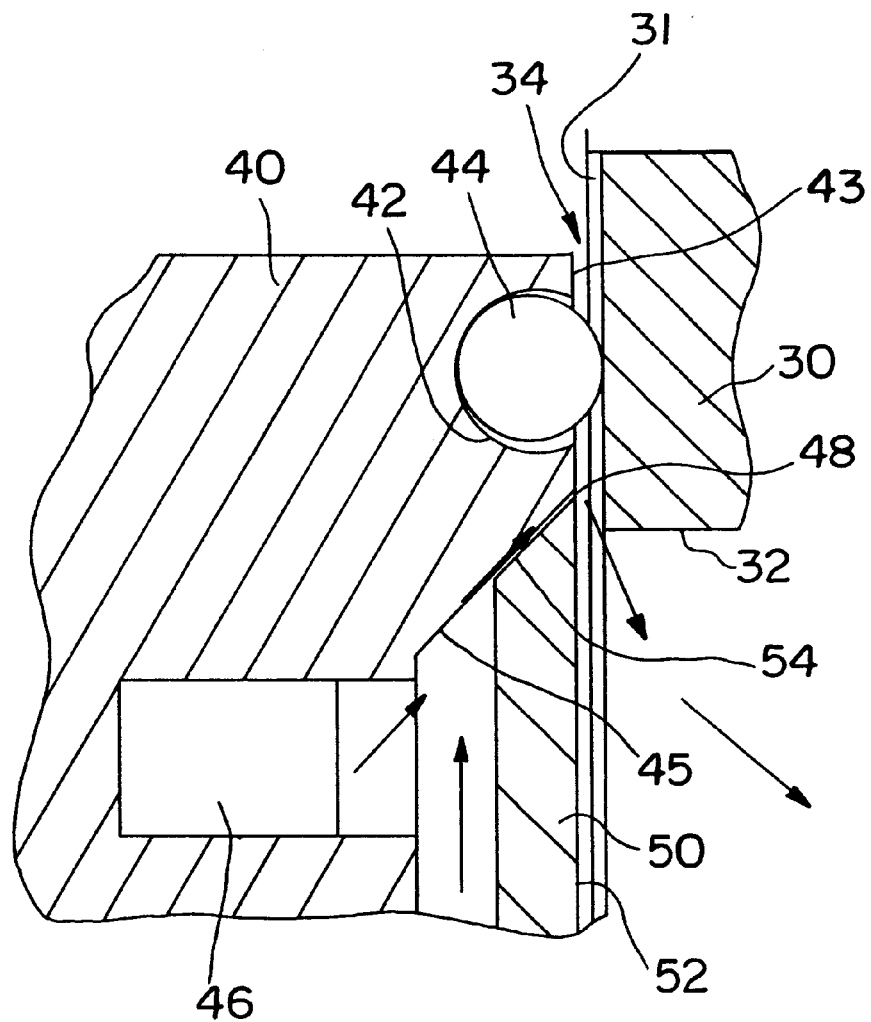
FIG. 2 is a cross-sectional elevational view of a portion of the vacuum valve of FIG. 1 showing the purge gas outlet and seal.
Figure 3:
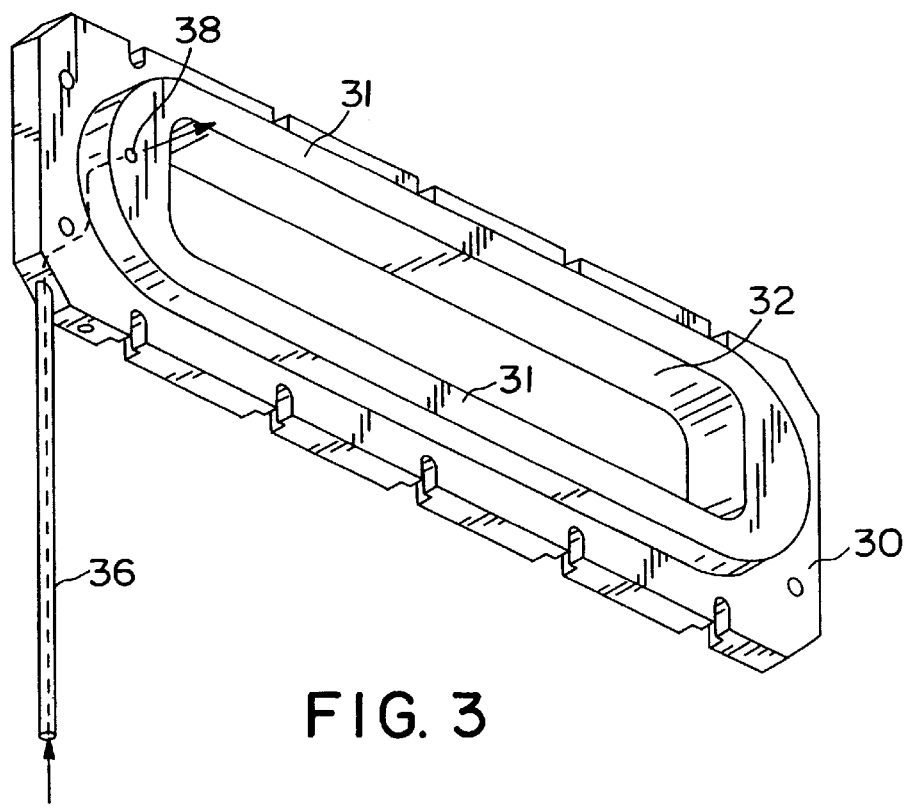
FIG. 3 is a perspective view of the seat portion of the vacuum valve of FIG. 1.
Figure 4:
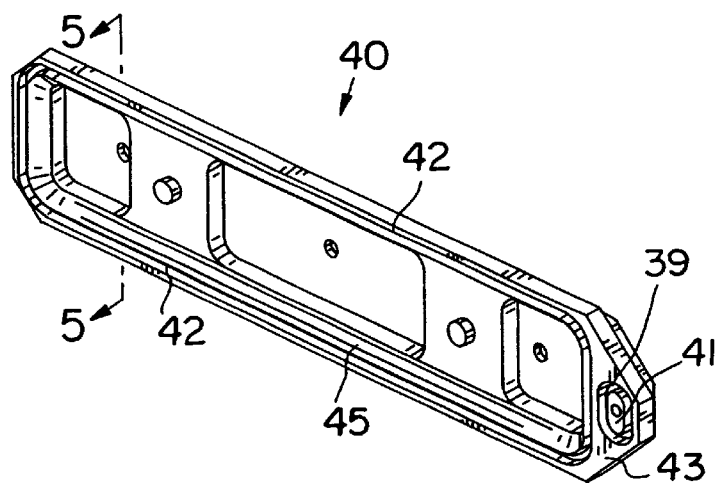
FIG. 4 is a perspective view of the gate portion of the vacuum valve of FIG. 1.
Figure 5:
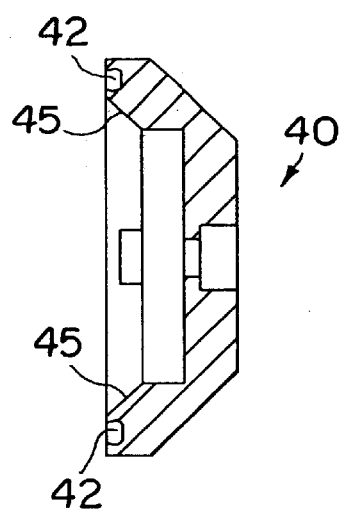
FIG. 5 is a cross-sectional elevational view of the gate of FIG. 4 along lines 5—5.
Figure 6:
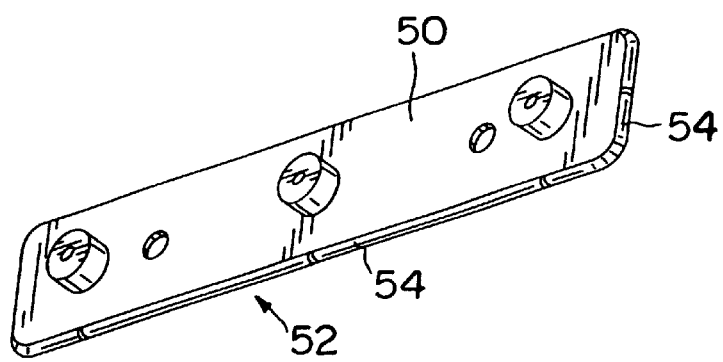
FIG. 6 is a perspective view of the gate insert portion of the slit valve of FIG. 1.
Figure 7:
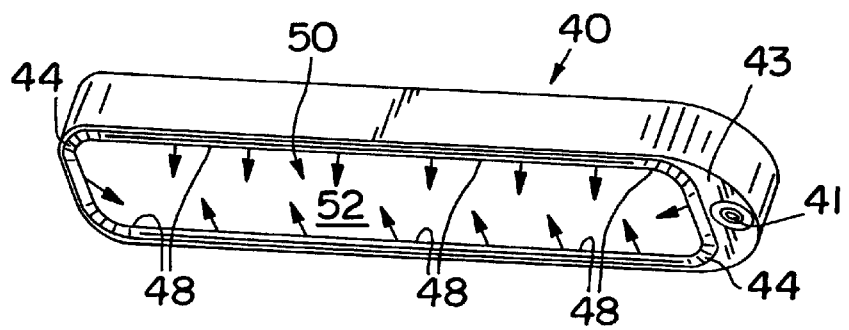
FIG. 7 is a perspective view of the assembled gate and insert portions of the vacuum valve of FIG. 1.

In describing the preferred embodiment of the present invention, reference will be made herein to FIGS. 1–11 of the drawings in which like numerals refer to like features of the invention. Features of the invention are not necessarily shown to scale in the drawings.

The preferred embodiment of the present invention provides a method and system whereby purge gas employed to protect the elastomeric seal in a gate valve, e.g., a slit valve, assembly utilized in microelectronic device processing chambers is distributed via an outlet that follows the approximately rectangular geometry of the seal, or whatever geometry the seal utilizes. The purge gas is flowed directly at the seal via a precision slit or one or more other opening in the gate or seat, and is not dependent upon the often irregular gap between the gate and seat for distribution of the purge gas.

In a first embodiment as shown in FIGS. 1–7, an otherwise conventional processing module 20 having slit valve opening 24 in wall 22 permits a microelectronic device wafer 26 to be moved into and out of the processing chamber. A transfer module 21 is attached to the process module in the vicinity of the opening 24 and facilitates the movement of the wafer 26 between stations into and out of the processing module. Between the transfer module and the processing module, there is a slit valve assembly which comprises a valve seat 30 and a valve gate 40. Gate 44 is moved into and out of position in seat 30 by an actuator 60.

Valve seat 30 has essentially a planar face 31 which is spaced from and opposite planar gate face 43. The generally rectangular slit valve opening in seat 30 is formed by opening or walls 32 and conforms to and is aligned with opening 24 in the process module. A groove 42 releaseably secures an elastomeric O-ring 44 and is configured so that the groove and O-ring received therein extend completely around gate face 43 and around seat opening 32. The size and material of the O-ring is selected so that when gate 40 is closed and sealed against seat 30, O-ring 44 provides a vacuum-tight seal between the seat and gate and further creates a gap 34 between seat face 31 and gate face 43. The elastomeric O-ring seal may be replaceable, or may be vulcanized to the groove, or may be attached to a thin frame so that the frame and seal may be removed or installed as a unit.

To provide a protective blanket of a purge gas in the vicinity of elastomeric O-ring 44 and protect the O-ring from any corrosive gases in the processing module 20 which flow into gate-seat gap 34, a purge gas outlet 48 comprises a slit in gate 40 which extends around the entirety of seat opening 32 in the vicinity of O-ring 44. Slit 48 meters the desired flow of purge gas to protect O-ring 44. Preferably slit 48 is narrower than gap 34 and is carefully controlled as desired to reduce excess purge gas flow. Such purge gas may interfere with the atmosphere required in processing chamber 20 and therefore excess quantities are undesirable. As an alternative to a slit, the present invention may use a series of holes or slots for the purge gas in the vicinity of O-ring 44. The slit, holes or slots preferably form an essentially continuous opening of purge gas outlet 48.

In the preferred embodiment depicted in FIGS. 1–7, gate purge gas outlet 48 is made by machining or otherwise forming an opening 45 in gate 40 which receives a gate insert 50. Gate insert 50 has approximately the same configuration as gate opening 45 but is formed so that when the insert is mated into the gate opening, a gap or slit is created which forms gas outlet opening between the two. Preferably, the insert has beveled edge 54 which corresponds to the angle of gate opening 45. To provide a manifold for distributing the purge gas to the purge gas port outlet, openings are created 46 within the gate 40 which may efficiently deliver the desired amount of purge gas flow to outlet 48. The gas inlet 41 provides a passageway connection to manifold 46.

To supply purge gas to gate inlet 41, the embodiment depicted utilizes an input line 36 which travels through seat 30 and out a transfer port 38 in seat face 31. This transfer port 38 aligns and mates by use of an O-ring or other seal 39 between the gate face 43 and seat face 31.

Thus, after a wafer is delivered into the process module 20, gate 40 containing gate insert 50 is mated with and sealed against seat 30 by actuator 60 to close slit valve opening 32. A purge gas is then pumped through input line 36 into seat 30 and out through seat transfer port 38 into gate inlet 41 where it is thereupon distributed by manifold 46 to outlet 48. Outlet 48, in the form of a slit or plurality of holes or slots, evenly distributes the gas in measured quantities to the vicinity of the continuous elastomeric seal 44 around the slit valve opening utilizing the gap 34 between the gate sealing face and the seat sealing face.

Figure 8:
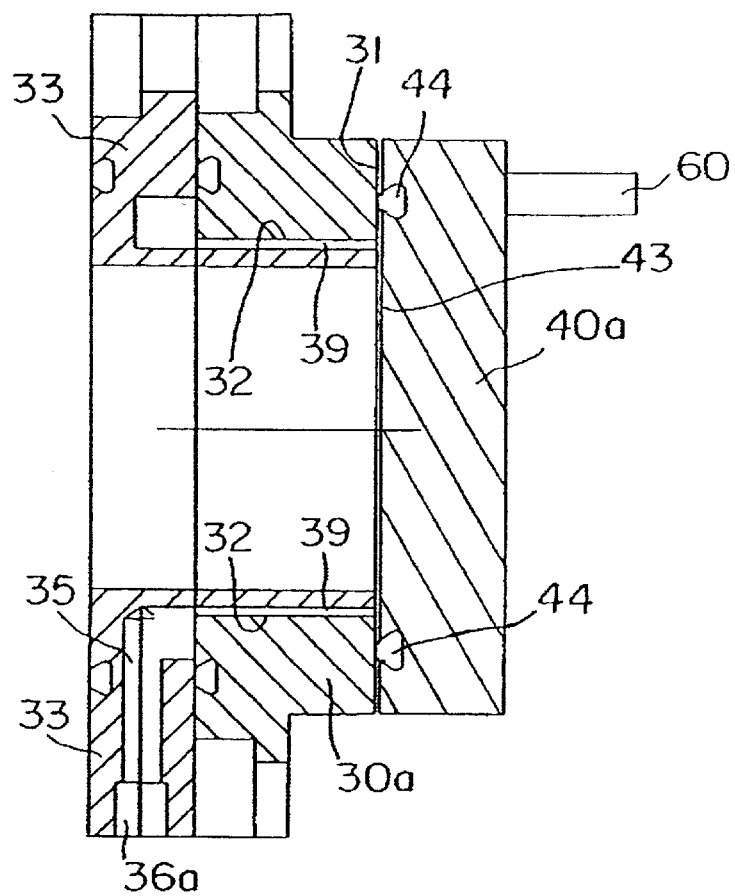
FIG. 8 is a cross-sectional elevational view of a second embodiment of the vacuum valve of the present invention.
Figure 9:
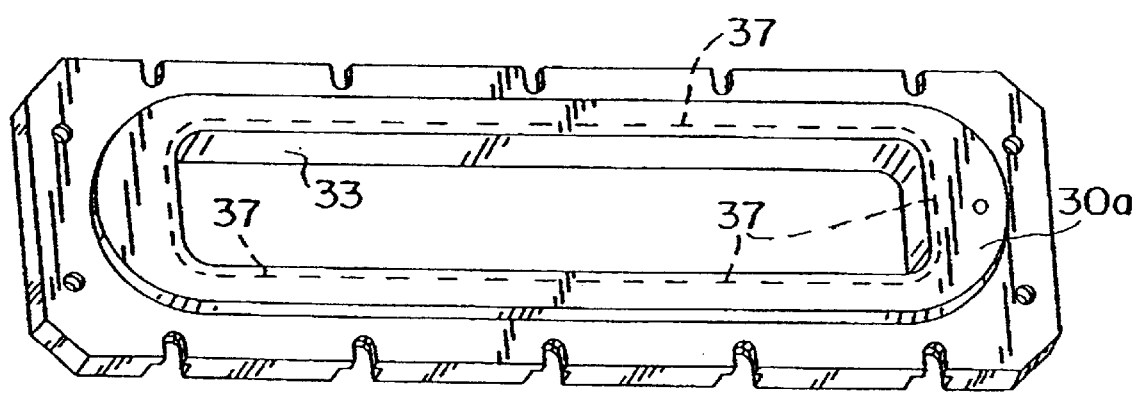
FIG. 9 is a perspective view of the seat portion of the vacuum valve of FIG. 8.
Figure 12:
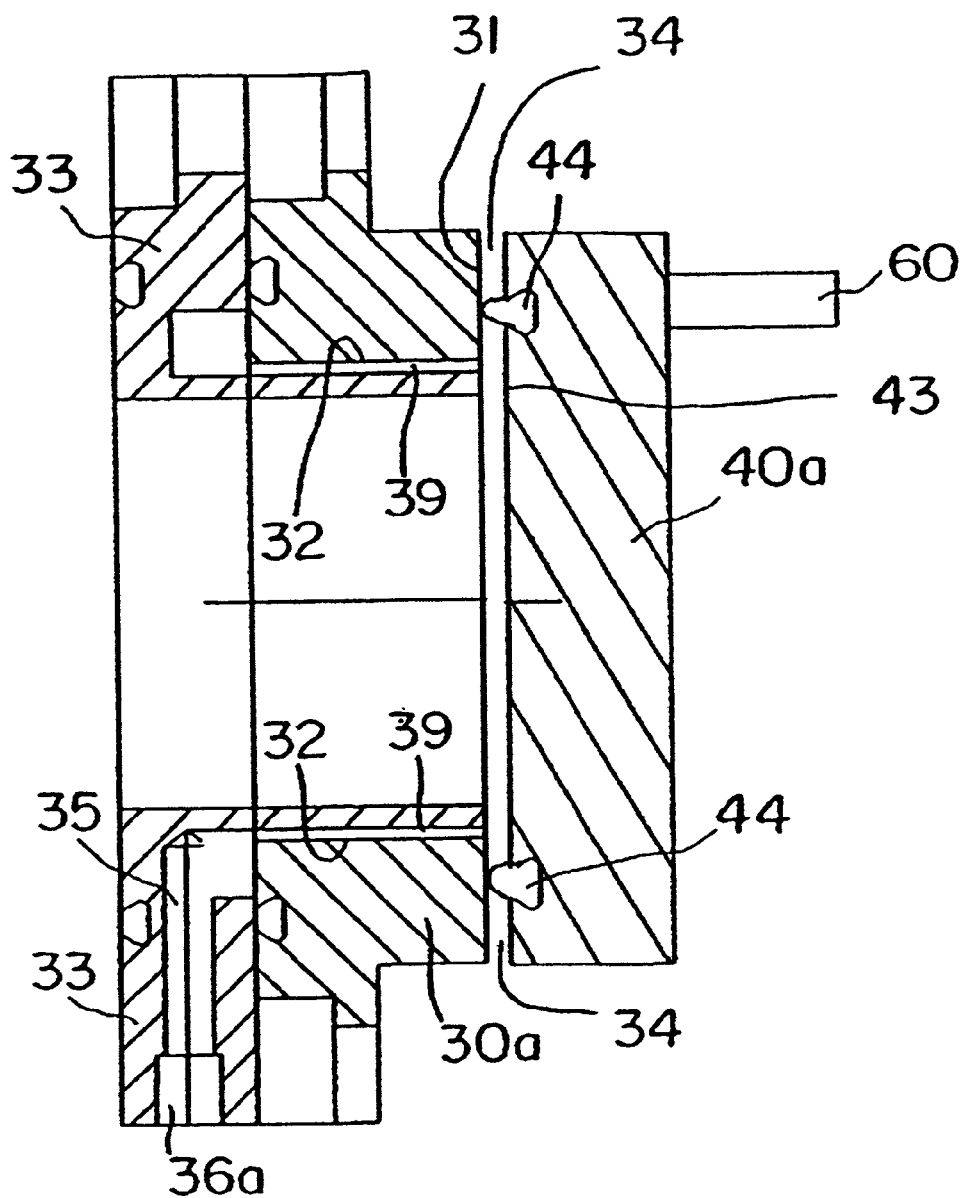
FIG. 12 is a cross-sectional elevational view of a modification of the second embodiment of the vacuum valve shown in FIG. 8.

In another embodiment of the invention depicted in FIGS. 8, 9 and 12, the purge gas outlet is provided in the seat 30A in the form of a continuous outlet 37 which again extends around the slit valve opening in the vicinity of the gate 40a seal 44. The continuous seal outlet 37 is formed by a seat insert 33 which fits within seat opening 32 and is spaced therefrom to create the controlled gap in outlet 39. As with the previous embodiment, it is preferred that this gap 39 which forms the continuous seat outlet is narrower than gap 34 between the gate face 43 and seat face 31, as shown in FIG. 12. Also, as with the previous embodiment, outlet 37 may comprise a plurality of holes, slots or other essentially continuous openings. Gas is provided to the seat outlet through an inlet 36A which connects to a manifold 35 which distributes the gas evenly to the seat outlet 39.

Figure 10:
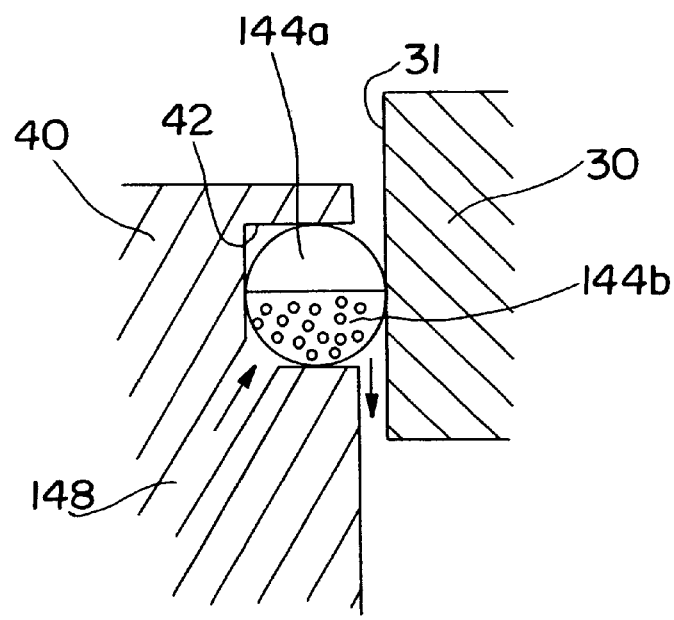
FIG. 10 is a cross-sectional elevational view of another embodiment of the purge gas outlet and seal employed in the vacuum valve of FIG. 2.
Figure 11:
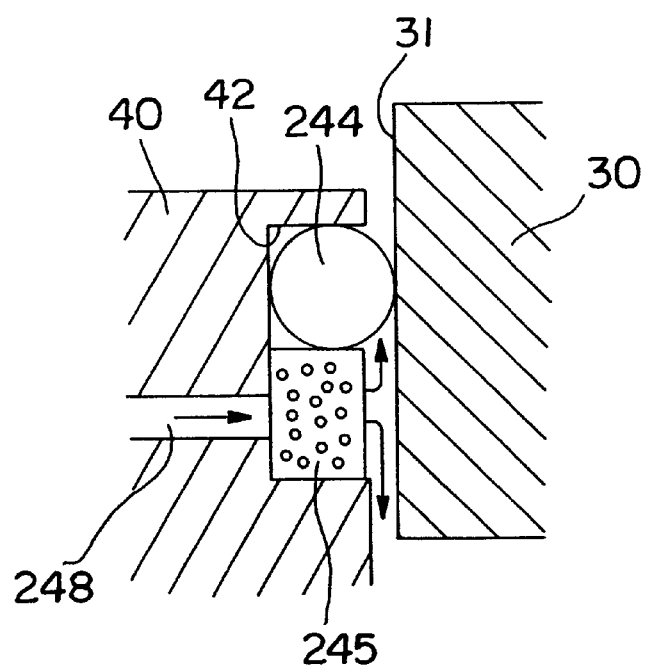
FIG. 11 is a cross-sectional elevational view of a further embodiment of the purge gas outlet and seal employed in the vacuum valve of FIG. 2.

Further embodiments of the purge gas outlet are depicted in FIGS. 10 and 11. In FIG. 10, purge gas outlet 148 extends through valve gate 40 into slit 42. The O-ring seated in slit 42 is partially an elastomeric seal 144a and partially a porous elastomer co-extrusion 144b. Porous portion 144b permits flow of the purge gas therethrough to protect elastomeric portion 144a. In FIG. 11, O-ring 244 is seated in groove 42 adjacent a porous media 245, such as a porous sintered metal such as stainless steel. Purge gas outlet 128 extends into groove 42 to direct flow of purge gas through porous media 245 and into the vicinity of O-ring 244. In each case, the purge gas is fed from the manifold through a porous co-extrusion (FIG. 10) or porous media (FIG. 11) so that it is distributed around the full extent of the slit valve in the vicinity of the O-ring seal to protect the O-ring during processing.

The present invention also provides for the use of a portion of the reactive gas, such as oxygen, to purge the area around the elastomeric seal 44. For example, where a reactive gas utilizes an oxygen carrier which dilutes the reactive gas, such oxygen carrier gas can be utilized as the purge gas. By way of example, and not limitation, $NF_3$ gas is utilized to perform in-situ cleaning of semiconductor wafers in the processing chamber. The $NF_3$ utilizes oxygen as a carrier gas. Oxygen may be directed through the purge gas port system and utilized in the present invention to prevent the more reactive gas (e.g., $NF_3$) from attacking the seal. The amount of oxygen utilized as the carrier gas is reduced by the amount which is used in the purge gas system, since the latter will eventually flow into the processing chamber and dilute the reactive gas as required. The amount of oxygen carrier gas to be used as a purge gas may be determined without undue experimentation for any particular reactive gas system.

Accordingly, the present invention achieves the objects above. The use of the continuous outlets around the seat opening in the vicinity of the seal permits more efficient usage of the purge gas. This opening may be essentially continuous and interrupted to a small degree without effecting the essentially continuous flow around the seat opening. Additionally, the use of non-inert carrier gases as purge gases reduces the attack of the reactive gas in the system on the elastomeric seals, and not interfering with the conventional gas chemistry within the processing chamber.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A vacuum valve assembly for use in a vacuum processing chamber comprising:

a vacuum processing chamber vacuum valve;

a seat defining an opening in said vacuum valve, said seat having a sealing face adjacent said opening and normal to the direction of said opening;

a gate having a sealing face adapted to mate with the seat sealing face, said gate being movable toward and away from the seat sealing face to seal and open the vacuum valve opening;

a continuous elastomeric seal around the vacuum valve opening between the gate sealing face and the seat sealing face of sufficient size such that when the gate is positioned to seal the vacuum valve opening, there exists a gap between the gate sealing face and the seat sealing face;

a purge gas port system disposed in the gate having (i) an inlet for a purge gas, (ii) an essentially continuous outlet extending around the vacuum valve opening and adjacent the elastomeric seal and gap, the outlet being defined by a first gate portion having the continuous elastomeric seal secured on the gate sealing face, a second gate portion secured within the first gate portion and facing the vacuum valve opening, the purge gas outlet being formed by a gap between the first and second gate portions extending essentially continuously around the first gate portion adjacent the elastomeric seal, and (iii) a manifold system connecting the inlet and the outlet, such that when a purge gas is introduced through the inlet, the manifold distributes the gas to the outlet which evenly distributes the gas to the vicinity of the continuous elastomeric seal around the vacuum valve opening in the gap between the gate sealing face and the seat sealing face.

2. The vacuum valve assembly of claim 1 wherein the gap between the first and second gate portions forming the purge gas outlet is smaller than the gap between the gate sealing face and the seat sealing face.

3. A vacuum valve assembly for use in a vacuum processing chamber comprising:

a vacuum processing chamber vacuum valve;

a seat defining an opening in said vacuum valve, said seat having a sealing face adjacent said opening and normal to the direction of said opening;

a gate having a sealing face adapted to mate with the seat sealing face, said gate being movable toward and away from the seat sealing face to seal and open the vacuum valve opening;

a continuous elastomeric seal around the vacuum valve opening between the gate sealing face and the seat sealing face of sufficient size such that when the gate is positioned to seal the vacuum valve opening, there exists a gap between the gate sealing face and the seat sealing face;

a purge gas port system having an inlet for a purge gas, an essentially continuous outlet extending around the vacuum valve opening and adjacent the elastomeric seal and gap, the outlet comprising a porous media adjacent the elastomeric seal, and a manifold system connecting the inlet and the outlet, such that when a purge gas is introduced through the inlet, the manifold distributes the gas to the outlet which evenly distributes the gas to the vicinity of the continuous elastomeric seal around the vacuum valve opening in the gap between the gate sealing face and the seat sealing face.

4. A vacuum valve assembly for use in a vacuum processing chamber comprising:

a vacuum processing chamber vacuum valve;

a seat defining an opening in said vacuum valve, said seat having a sealing face adjacent said opening and normal to the direction of said opening;

a gate having a sealing face adapted to mate with the seat sealing face, said gate being movable toward and away from the seat sealing face to seal and open the vacuum valve opening;

a continuous elastomeric seal around the vacuum valve opening between the gate sealing face and the seat sealing face of sufficient size such that when the gate is positioned to seal the vacuum valve opening, there exists a gap between the gate sealing face and the seat sealing face;

a purge gas port system having an inlet for a purge gas, an essentially continuous outlet extending around the vacuum valve opening and adjacent the elastomeric seal and gap, the outlet comprising a porous portion of the elastomeric seal, and a manifold system connecting the inlet and the outlet, such that when a purge gas is introduced through the inlet, the manifold distributes the gas to the outlet which evenly distributes the gas to the vicinity of the continuous elastomeric seal around the vacuum valve opening in the gap between the gate sealing face and the seat sealing face.

5. A vacuum processing chamber comprising:

a vacuum processing chamber having a vacuum valve;

a seat defining an opening in said vacuum valve, said seat having a sealing face adjacent said opening and normal to the direction of said opening;

a gate having a sealing face adapted to mate with the seat sealing face, said gate being movable toward and away from the seat sealing face to seal and open the vacuum valve opening, said gate including a continuous elastomeric seal on the gate sealing face around the vacuum valve opening of sufficient size such that when the gate is positioned to seal the vacuum valve opening, there exists a gap between the gate sealing face and the seat sealing face;

a purge gas port system in the gate having (i) an inlet for a purge gas, (ii) an essentially continuous outlet in the gate sealing face extending around the vacuum valve opening and within and adjacent the elastomeric seal, outlet being defined by a first gate portion having the continuous elastomeric seal secured on the gate sealing face and a second gate portion secured within the first gate portion and facing the vacuum valve opening, the purge gas outlet being formed by a gap between the first and second gate portions extending essentially continuously around the first gate portion adjacent the elastomeric seal, and (iii) a manifold system connecting the inlet and the outlet, such that when a purge gas is introduced through the inlet, the manifold distributes the gas to the outlet which evenly distributes the gas to the vicinity of the continuous elastomeric seal around the vacuum valve opening in the gap between the gate sealing face and the seat sealing face.

6. The vacuum valve assembly of claim 5 wherein the gap between the first and second gate portions forming the purge gas outlet is smaller than the gap between the gate sealing face and the seat sealing face.

7. A vacuum processing chamber comprising:

a vacuum processing chamber having a vacuum valve;

a seat defining an opening in said vacuum valve, said seat having a sealing face adjacent said opening and normal to the direction of said opening;

a gate having a sealing face adapted to mate with the seat sealing face, said gate being movable toward and away from the seat sealing face to seal and open the vacuum valve opening, said gate including a continuous elastomeric seal on the gate sealing face around the vacuum valve opening of sufficient size such that when the gate is positioned to seal the vacuum valve opening, there exists a gap between the gate sealing face and the seat sealing face;

a purge gas port system in the seat having (i) an inlet for a purge gas, (ii) an essentially continuous outlet formed by a gap in the seat sealing face extending around the vacuum valve opening and within and adjacent the elastomeric seal, the gap in the seat forming the purge gas outlet being smaller than the gap between the gate sealing face and the seat sealing face, and (iii) a manifold system connecting the inlet and the outlet, such that when a purge gas is introduced through the inlet, the manifold distributes the gas to the outlet which evenly distributes the gas to the vicinity of the continuous elastomeric seal around the vacuum valve opening in the gap between the gate sealing face and the seat sealing face.

8. A vacuum valve assembly for use in a vacuum processing chamber comprising:

a vacuum processing chamber vacuum valve;

a seat defining an opening in said vacuum valve, said seat having a sealing face adjacent said opening and normal to the direction of said opening;

a gate having a sealing face adapted to mate with the seat sealing face, said gate being movable toward and away from the seat sealing face to seal and open the vacuum valve opening;

a continuous elastomeric seal around the vacuum valve opening between the gate sealing face and the seat sealing face of sufficient size such that when the gate is positioned to seal the vacuum valve opening, there exists a gap between the gate sealing face and the seat sealing face;

a purge gas port system having an inlet for a purge gas, an essentially continuous outlet extending around the vacuum valve opening and adjacent the elastomeric seal and gap, the purge gas outlet being formed by an opening narrower than the gap between the gate sealing face and the seat sealing face, and a manifold system connecting the inlet and the outlet, such that when a purge gas is introduced through the inlet, the manifold distributes the gas to the outlet which evenly distributes the gas to the vicinity of the continuous elastomeric seal around the vacuum valve opening in the gap between the gate sealing face and the seat sealing face.

* * * * *